United States Patent
Magnuson et al.

(10) Patent No.: US 10,101,360 B2
(45) Date of Patent: Oct. 16, 2018

(54) LINK SOCKET SLIDING MOUNT WITH PRELOAD

(71) Applicant: Xcerra Corporation, Norwood, MA (US)

(72) Inventors: Aaron Magnuson, Centerville, MN (US); Sergey Yakushev, Maple Grove, MN (US); Valts Treibergs, White Bear Township, MN (US); Dan Sikorski, Minneapolis, MN (US)

(73) Assignee: Xcerra Corporation, Norwood, MA (US)

( * ) Notice: Subject to any disclaimer, the term of this patent is extended or adjusted under 35 U.S.C. 154(b) by 64 days.

(21) Appl. No.: 15/341,368

(22) Filed: Nov. 2, 2016

(65) Prior Publication Data
US 2018/0120348 A1    May 3, 2018

(51) Int. Cl.
*G01R 1/04*      (2006.01)
*G01R 31/26*     (2014.01)
*H01R 12/85*     (2011.01)
*H01R 9/05*      (2006.01)

(52) U.S. Cl.
CPC ................. *G01R 1/0433* (2013.01)

(58) Field of Classification Search
CPC .. G01R 1/0433; H01R 12/85; H01R 12/7076; H01R 12/7005; H01R 13/22
See application file for complete search history.

(56) References Cited

U.S. PATENT DOCUMENTS

| | | | | |
|---|---|---|---|---|
| 5,841,640 | A * | 11/1998 | Shibata ................ | H05K 7/1023 361/679.01 |
| 7,918,669 | B1 * | 4/2011 | Tiengtum ............. | G01R 1/0466 324/754.03 |
| 8,758,027 | B1 * | 6/2014 | Landa .................. | G01R 1/0466 439/66 |
| 9,429,591 | B1 | 8/2016 | Johnson et al. | |

(Continued)

OTHER PUBLICATIONS

Dec. 22, 2017—Int'l Search Report for PCT/US2017/056175.

*Primary Examiner* — Huy Q Phan
*Assistant Examiner* — Zannatul Ferdous
(74) *Attorney, Agent, or Firm* — Fulwider Patton LLP

(57) ABSTRACT

A test socket with a link and mount system is used to couple a device under test to a testing apparatus for quick and reliable testing of microchips post-production. The socket includes a pivoting link that connects to the DUT, an elastomer for biasing the link in a first preferred orientation, and a mount that operates as a fulcrum to rotate the link into engagement with the DUT. The mount includes projections that extend below a bottom surface of the socket, such that engagement of the mount with the test device at the projections translates the mount parallel to a diagonal support wall in the socket such that the mount is driven away from the bottom surface of the socket and also toward the elastomer. The socket includes a gap above the mount to allow for movement of the mount within the socket, eliminating the fixed arrangement and the non-compliant loads that accompany the engagement of the mount to the test apparatus. The mount projections carry a small preload that ensures successful contact with the test equipment without the risk of damaging the test equipment with rigid contact surfaces.

4 Claims, 5 Drawing Sheets

(56) References Cited

U.S. PATENT DOCUMENTS

| | | | |
|---|---|---|---|
| 2004/0137774 A1* | 7/2004 | Shimizu | H01R 12/88 |
| | | | 439/268 |
| 2005/0221675 A1 | 10/2005 | Rathburn et al. | |
| 2007/0032128 A1 | 2/2007 | Lopez et al. | |
| 2011/0201221 A1* | 8/2011 | Kobayashi | G01R 1/0466 |
| | | | 439/331 |
| 2015/0015293 A1 | 1/2015 | Johnson et al. | |
| 2015/0372407 A1 | 12/2015 | Landa | |
| 2016/0109480 A1* | 4/2016 | Han | G01R 1/0433 |
| | | | 324/756.02 |

* cited by examiner

LINK SOCKET SLIDING MOUNT WITH PRELOAD

BACKGROUND

Microchips have become prevalent in virtually all types of industries, and the demand for microchips has skyrocketed over the last ten years. This has placed pressure on the industry to make more and better chips as the need for microchips continues to rise. A chip connects to a motherboard or other device via a plurality of pins or terminals, which allows the board to communicate with the chip's logic or memory. An example of such a chip may be a memory card or processor for a computer, each of which may be insertable into a particular slot or socket that makes one or more electrical connections with the chip.

Part of the manufacturing process of the chips is the post-production testing of the quality and performance of the chip. Testing helps to diagnose problems in the manufacturing process, and improve production yields for systems that incorporate the chips. Therefore, sophisticated test systems have been developed to ensure that the circuitry in the chip performs as designed. A randomly selected chip is obtained from a production batch and attached to a tester or test socket. The selected test chip is referred to as a device under test, or "DUT." The test socket is connected to a test apparatus that sends signals to the chip and evaluates the responsiveness and effectiveness of the chip as manufactured. In general, it is desirable to perform the attachment, testing, and detachment as rapidly as possible, so that the throughput of the tester may be as high as possible.

The test apparatus accesses the chip's circuitry through the same pins or terminals that will later be used to connect the chip in its final application. Accordingly, it is preferable that the test apparatus establish a reliable electrical contact with the chip's various pins or terminals so that the pins are not damaged, while maintaining a sound electrical connection with the pins. Most test apparatus of this type use mechanical contacts between the chip pins and the contacts on the test apparatus, rather than a more permanent attachment of the chip to the tester. When the chip is inserted in the test socket and coupled electrically to the test apparatus, each pin on the chip is engaged mechanically and electrically with a corresponding electrical connector on the test apparatus.

Preferably, the testing procedure involves as little mechanical wear on the chip and the test apparatus as possible during the attachment, testing, and detachment procedures. Typically, the test apparatus is designed to leave the chips in a final state that resembles the initial state as closely as possible. In addition, it is also desirable to avoid or reduce any permanent damage to the tester or tester pads, so that tester parts may last longer before replacement.

U.S. Pat. No. 7,918,669 to Tiengtum entitled "Integrated circuit socket with a two-piece connector with a rocker arm", the contents of which are fully incorporated herein by reference, describes a test socket that can be used to couple the DUT with a test apparatus. The '669 Patent discloses a two piece connector that pivots when a test chip is placed on the socket so as to make contact between a contact pad on the chip and the another electrical contact on the test apparatus, enabling an evaluation of signal transmission by the chip. The platform houses a resilient tubular elastomer that biases the connector assembly in a disengaged position out of contact with the test apparatus. When the chip is placed on the socket, the linkage pivots and the bias of the resilient tubular member is overcome by the downward force applied by the chip, and an electrical connection is established across the connector assembly.

While the system of the '669 Patent has been proven effective in the testing of integrated chips, the wear on the test apparatus from the linkage leads to costly and time-consuming maintenance on the test equipment. The mount in the linkage is rigidly fixed in the test socket, and applies a non-compliant pre-loading on the test apparatus that can lead to excessive wear. In order to ensure a reliable connection, the mount was secured to the socket so as to be fixed.

Due to variances between the test equipment and the socket, it is possible that a gap can occur between the test equipment and the socket's electrical connector (mount). This gap can result in failed tests or improper measurements that can prolong the testing procedure and falsely suggest problems with the DUT. An improvement is needed to ensure a more reliable connection between the mount and the test equipment that does not result in excessive forces applied to the test equipment.

SUMMARY OF THE INVENTION

The present invention is a test socket with a link and mount system that is used to couple a device under test to a testing apparatus for quick and reliable testing of microchips post-production. The socket includes a pivoting link that connects to the DUT, an elastomer for biasing the link in a first preferred orientation, and a mount that operates as a fulcrum to rotate the link into engagement with the DUT. The mount includes projections that extend below a bottom surface of the socket, such that engagement of the mount with the test device at the projections translates the mount parallel to a diagonal support wall in the socket such that the mount is driven inward and also toward the elastomer. The socket includes a gap above the mount to allow for movement of the mount within the socket, eliminating the fixed arrangement and the non-compliant loads that accompany the engagement of the mount to the test apparatus. The mount projections carry a small preload that ensures successful contact with the test equipment without the risk of damaging the test equipment with rigid contact surfaces. Analysis shows that the loads on the test equipment can be dramatically reduced by the present invention while still maintaining an effective connection between the testing apparatus and the chip.

The objects and features of the invention will best be understood with reference to the accompanying drawings and the detailed description of the invention set forth below.

DETAILED DESCRIPTION OF THE PREFERRED EMBODIMENTS

Figure 1:
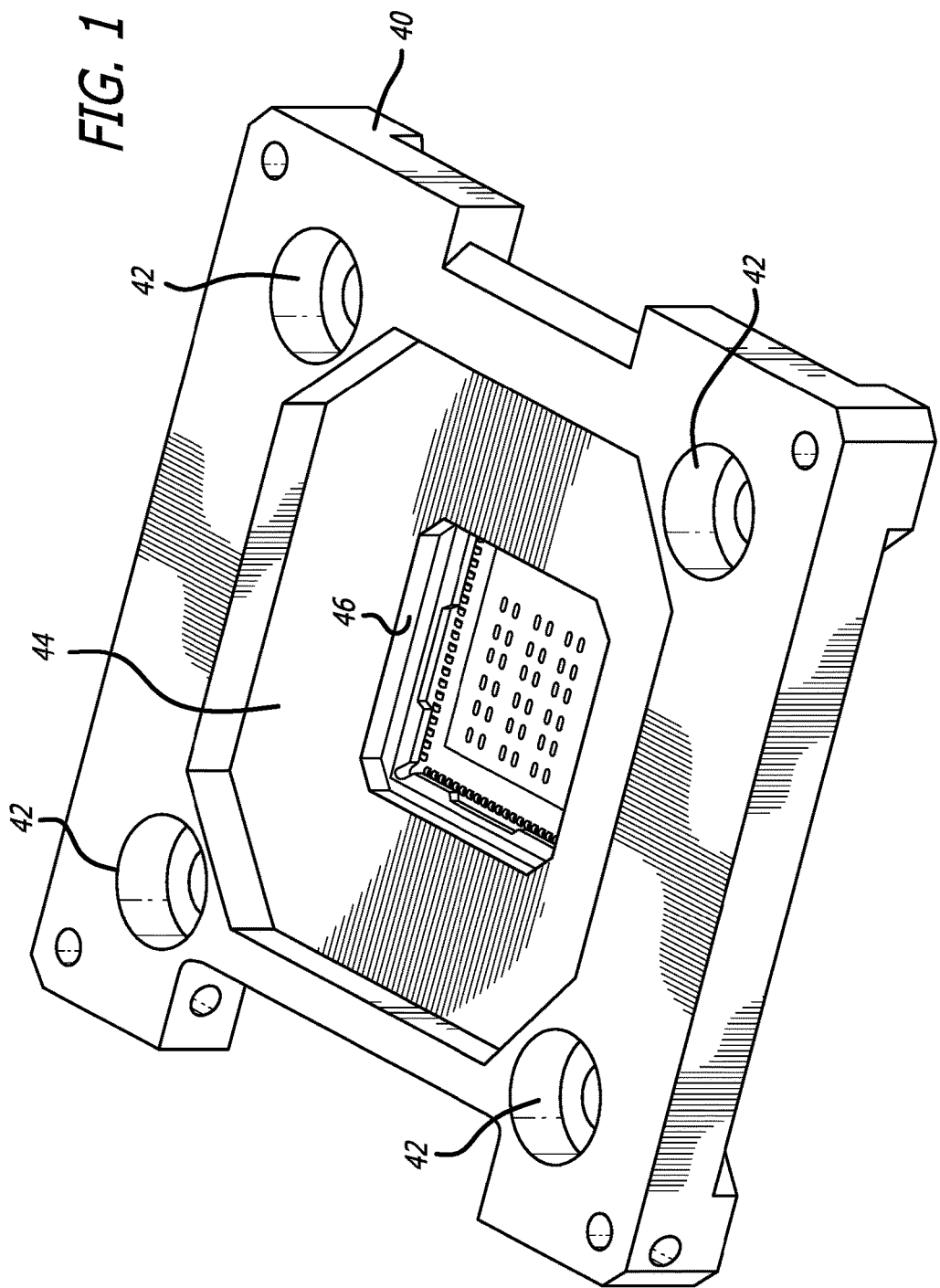
FIG. 1 an elevated, perspective view of a socket used to test integrated circuits using the contact of the present invention.

FIG. 1 illustrates an integrated circuit test socket 40 of the type generally described in U.S. Pat. No. 7,918,669, the contents of which are incorporated herein. The test socket 40 may have a generally square profile with up to four aligning holes 42 to mount the test socket on the testing equipment. On the test socket is a generally square recess 46 is formed to receive the integrated circuit chip under test. A plurality of electrical connections are formed within the recess 46 as described more fully in the '669 patent referenced above. The test socket 40 may be placed, for example, in a handler work press and clamped in the handler in anticipation of testing the integrated chip. Once the socket is mounted in the handler, the chip is inserted into the socket for testing by placing it in the recess 46. Other arrangements, both automated and manual, are also possible with the present invention.

Figure 2:
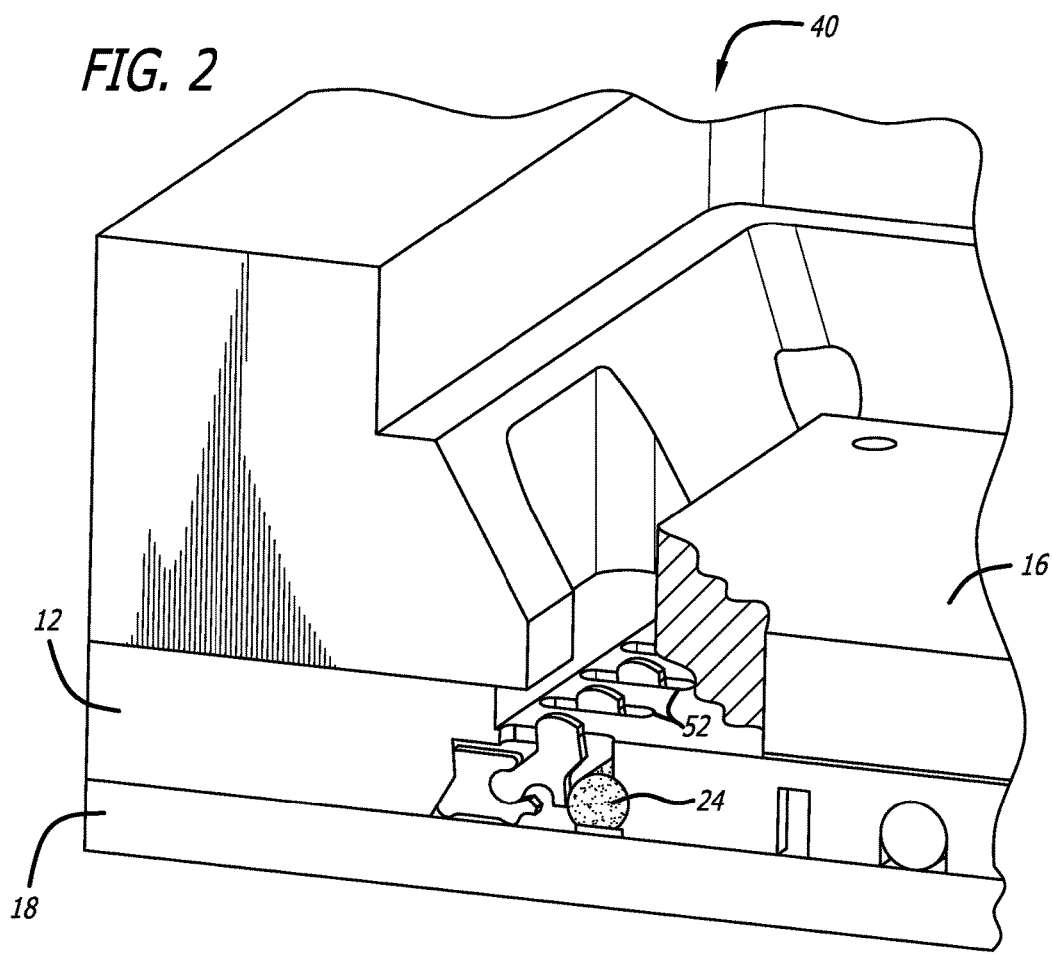
FIG. 2 is an enlarged, partially cut away perspective view of the contact of the present invention.

FIG. 2 illustrates a chip 16 (partially cut away) inserted into the socket 40. The chip 16 is formed with electrical connections 17 that receive and/or transmit signals, and the test equipment 18 includes electrical connectors 19 that are designed to communicate and evaluate the signal transmission from the chip 16. The quality and integrity of the signal transmitted by the chip can be evaluated by the test equipment 18, as well as a signal received by chip from the test equipment. In this manner, the response of the chip to contact and temperature can be tested prior to shipment of the chip. To avoid soldering the chip 16 to the test equipment 20, the test socket 40 includes a base 12 with a plurality of electrical linkages that, when the chip 16 is placed on the base 12, provides an electrical path from the chip 16 to the test equipment 18 so that the chip can be reliably tested without damaging the chip. The base 12 is provided with a plurality of cavities 50 that are aligned along an edge of the socket 40 and each cavity 50 has associated with it a first opening 52 in the upper surface that allows a contact link to protrude through.

In each cavity 50 resides a resilient tubular member 24 made of a polymer that can provide a biasing force on the contact links to maintain the links in a desired orientation or position while maintaining a preload force against the test equipment. The resilient tubular members 24 are positioned in the respective cavities 50 adjacent the contact links accessible through the side of the base 12. In a preferred embodiment, the tubular members 24 are cylindrical but other shapes are used to bias the contact links.

Each cavity 50 includes a designated contact link positioned to make contact with an associated pin, pad, or other electrical connector 17 on the chip 16 to be tested. Each contact link is biased by the resilient tubular member 24 so as to extend from its associated cavity 50 through its associated first opening 52. The contact links are biased by its respective tubular member 24 in a first extended position toward the chip connector 17, and each contact link is arranged for pivotal movement about an axis parallel to the axis of the respective tubular member 24.

Figure 3:
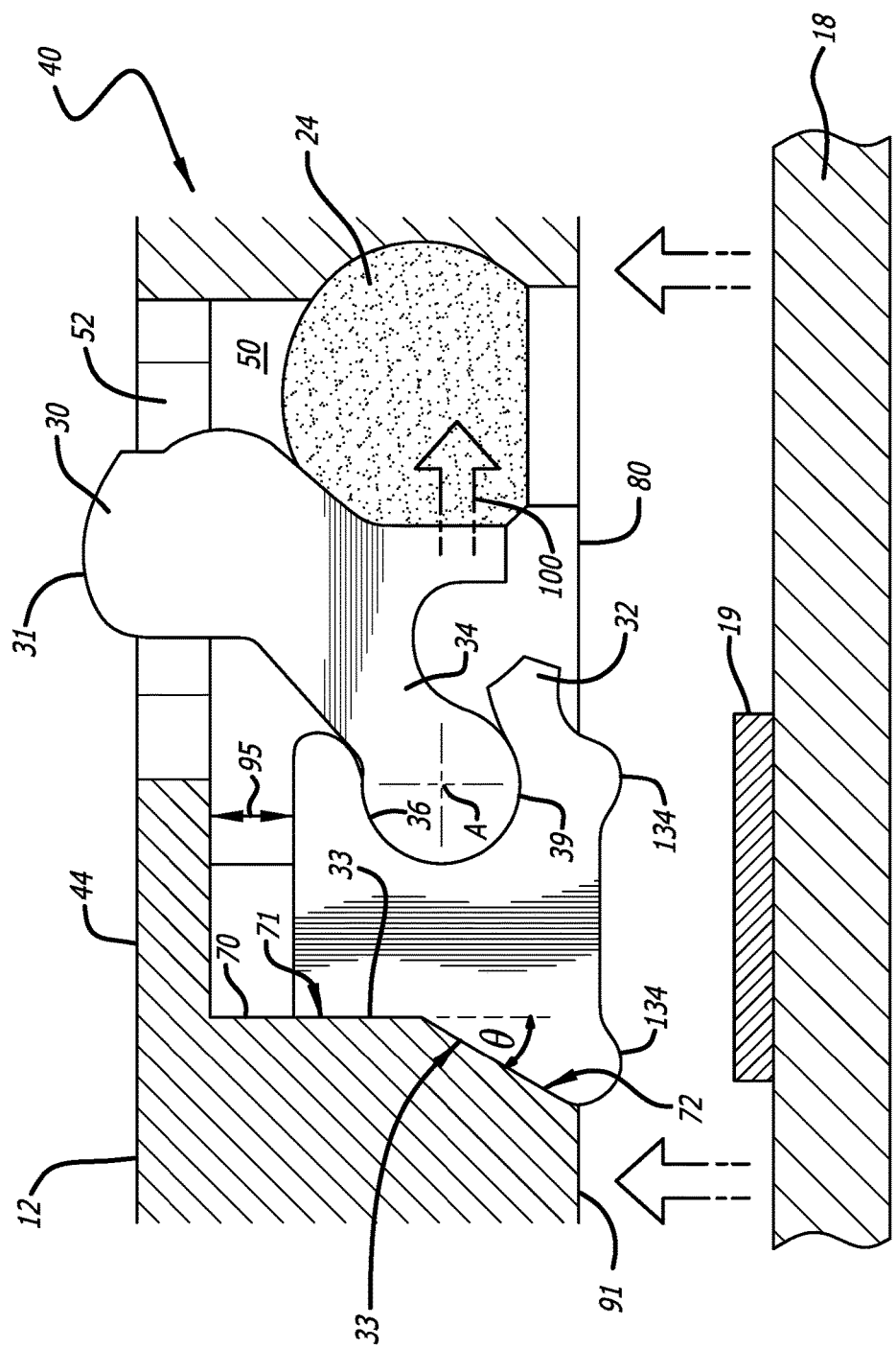
FIG. 3 is a cross-sectional view of the contact of the link, mount, and socket prior to insertion into the test equipment.
Figure 4:
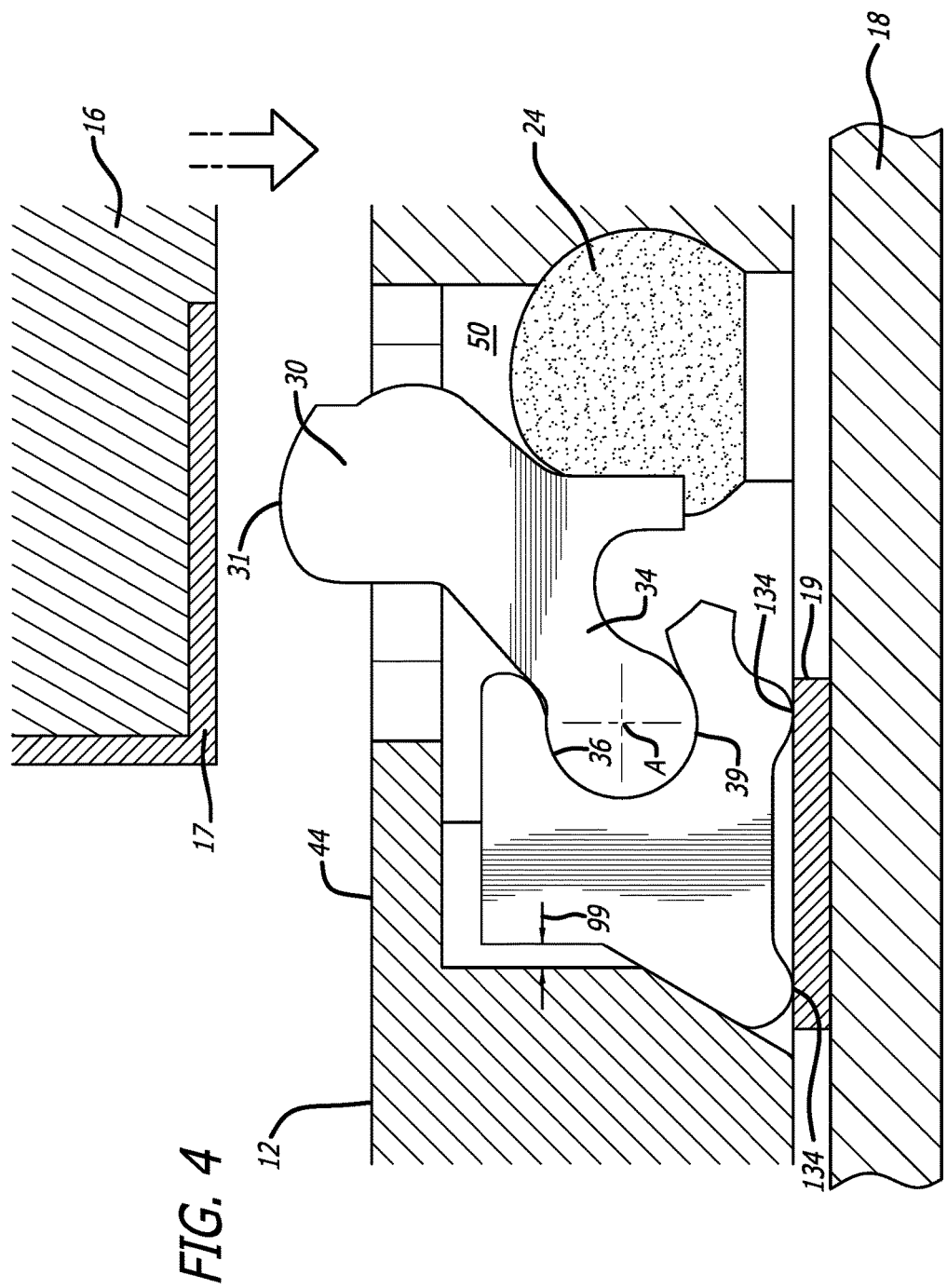
FIG. 4 is a cross-sectional view of the contact of the link, mount, and socket after insertion into the test equipment.
Figure 5:
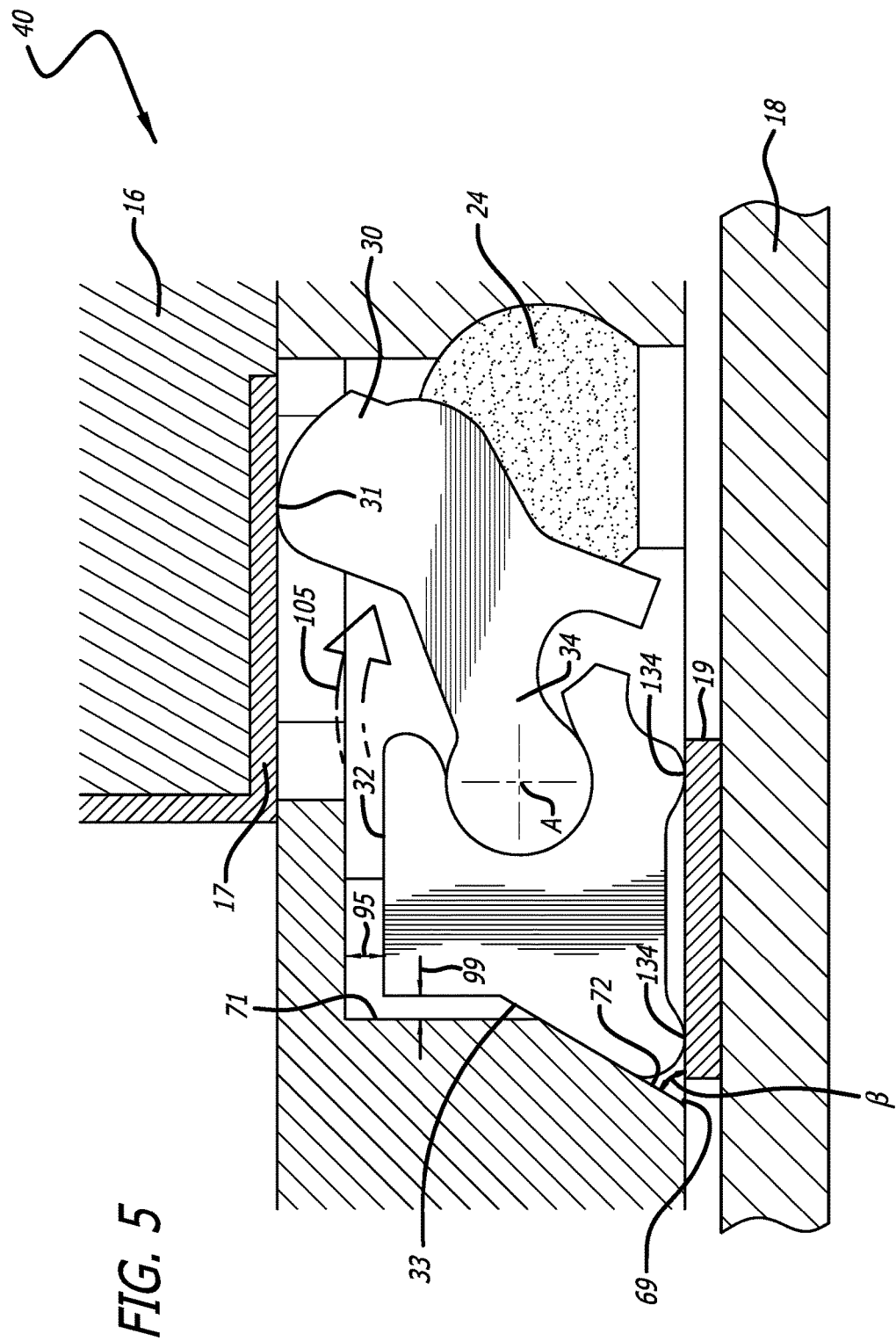
FIG. 5 is a cross-sectional view of the contact of the link, mount, and socket with the DUT in the socket.

Turning to FIGS. 3-5, the socket and the linkages and their relationship with the test equipment and the DUT will be described in further detail. The linkage is formed by a link member 30 bearing against the tubular elastomer 24, and a mount member 32 within the cavity 50 of the base 12. The link member 30 pivots about the mount member 32 so as to form an electrical connection therebetween while applying pressure to the chip 16 at the connector 17. The mount member 32 has electrical connectors in the form of protrusions 134 that make contact with the connectors 19 on the test equipment 18 to complete the electrical circuit between the chip 16 and the test equipment 18. A complete discussion of this arrangement is disclosed in U.S. Pat. No. 7,918,669 referenced above. In the linkage, the elastomer 24 rotationally biases the link member 30 upward through the opening 52, but allows the link member 30 to also compress the elastomer 24 when a chip 16 is placed in the socket 40. The link member 30 is preferably formed with a rounded contact surface 31 for rolling contact with the connector 17 of the chip 16 as the chip rocks the link 30 downward into the chamber 50. FIG. 3 illustrates the link member 30 in the unloaded condition, where the elastomer 24 biases the link member 30 upward (counterclockwise in FIG. 3) to a position above an upper surface 44 of the base 12 when no downward force is applied to the linkage. The link member 30 is also formed with a leg portion 34 terminating in a cylindrical protuberance 36. When the leg portion 34 bears against the mount member 32, a lateral force (signified by arrow 100) is applied to the elastomer 24, and the resultant force of the elastomer establishes the position of the contact surface 31 within the opening 52.

The mount 32 includes a cylindrical recess 39 that is sized to receive the cylindrical protuberance 36 of the link member to form a joint hinge. That is, the link member 30 can rotate about the mount member 32 only in a single plane perpendicular to the longitudinal axis "A" of the cylindrical protuberance 36. The rear wall 70 of the base 12 includes a vertical section 71 and an inclined section 72, where the inclined section 72 is angled away from the linkage as shown in FIG. 3 such that the wall 70 forms a recess 69 defined by an acute angle θ with a vertical line extended downward from the vertical section 71. In a preferred embodiment, θ is thirty degrees (30°), such that an angle β that is formed by the opening of the recess with the plane 91 of the bottom of the base 12 is sixty degrees (60°) and opens to the bottom of the socket 40. The recess 69 opens from the cavity 50 downward to extend the opening 80 of the base 12. The mount member 32 includes a bearing surface 33 that bears against the rear wall 70 of the base, where the bearing surface 33 includes a congruently angled surface that coincides with the inclined section of the rear wall 70 of the base, and a vertical surface that bears against the vertical section 71 of the rear wall 70 (see FIG. 3). The mount member 32 further comprising protrusions 134 that project downwardly from an underside of the mount member 32 through an opening 80 in the socket 40 when there is no upward force applied to the mount (via the protrusions) from the test equipment 18. The protrusions 134 are preferably rounded and form an electrical connection with a connector pad 19 on the test equipment 18 when the socket 40 is placed on the test equipment. The cavity 50 is sized so that, when the mount is unloaded and the protrusions 134 are disposed below the socket's lower plane 91 as shown in FIG. 3, a gap 95 exists between the top of the mount and the top of the cavity.

FIG. 4 illustrates the condition where the base 12 of the socket 40 is placed on the test equipment 18 to begin testing of the chip 16. The protrusions 134 make contact with the electrical pad 19 of the test equipment 18, and as the socket 40 is brought to bear on the test equipment 18, the mount member 32 is driven upward by the force of the test equipment 18. Because the mount member 32 includes the angled surface 33 bearing against the angled portion 72 of the rear wall 70, the mount member 32 slides diagonally along the wall's surface toward the elastomer 24 and against a resisting force of the elastomer applied via the link member 30. This movement of the mount member 32 causes a separation 99 of the mount member 32 from the vertical section 71 of the rear wall 70. The inclined section 72 of the wall directs the mount member 32 toward the elastomer 24, which in turn elevates the link member 30 above the upper surface 44 of the base 12. The movement of the mount member 32 upward in the cavity 50 reduces the gap 95 between the top of the mount member 32 and the top of the cavity 50, but the height of the protrusions 134 are preferably set to be less than the initial gap 95 so that the mount member 32 cannot make contact with the upper surface of the cavity. That is, a gap 95 is always maintained when the socket 40 is placed on the test equipment 18 despite the movement of the mount member 32 upward in the cavity due to the force on the protrusions 134, and the initial gap 95 exceeds a distance that the protrusions 134 downwardly project below the lower surface of the base when no upward force is applied to the protrusions. Note that the elastomer 24 resiliently forces the link 30 to apply a preload to the test equipment 18 by the mount 32 by the interaction of the inclined surface of the socket wall 72 and the mount's inclined portion 33, resulting in a downward preload force on the electrical connector 19.

In FIG. 5, the chip 16 is placed on the socket 40. This causes the link member 30 to rotate in the direction of arrow 105 into the socket 40 against the force of the chip 16. The electrical connector 17 on the chip 16 is maintained in contact with the link member's rounded upper surface 31 by virtue of the resiliency of the elastomer 24 and the pivoting force of the mount member 32. Thus, an electrical path exists between the chip 16, through the electrical connector 17, through the link member 30, through the mount member 32, through the electrical connector 19, to the test equipment 18. In this manner, solid and reliable contact is established with the chip at each connector, which can then be measured by transmitting a signal through the test equipment.

The inclined or slanted back wall of the socket and complementary surface on the mount member provides for a compliant preloading of the linkage when the socket 40 is placed on the test equipment 18, resulting in a better and more reliable electrical connection between the mount and the test equipment. The small gap (25-50 microns) that is present between the mount and the upper surface of the socket's cavity protects the test equipment from undue forces that can result from compressing the mount against the test equipment. In the absence of any upward loading on the mount by the test equipment, the mount member is simply secured in the cavity against the rear wall by the force of the elastomer via the link member.

When the mount member is pushed upward by the test equipment, it slides upward against the inclined wall until the bottom of the protrusions are flush with the bottom of the base of the socket. A compliant preload is present to ensure solid contact, and a gap is maintained between the mount member and the socket cavity's upper surface to prevent compressive loads from building up in the mount member. The compliant preload on the mount's contact with the test equipment allows for mechanical tolerances that could otherwise result in small gaps between the socket and the test equipment (especially in large DUTs). Analysis has shown that without the mechanical preload from the present invention, the force applied on the PCB (test equipment) is only 1.7 g of force. The present invention increases this force by a factor of four, resulting in a significantly improved electrical contact without risking high stress loading on the test equipment.

It will be understood that this disclosure is merely illustrative, and that it is to be further understood that changes may be made in the details, particularly in matters of shape, size, material, and arrangement of parts without exceeding the scope of the invention. Accordingly, the scope of the invention is as defined in the language of the appended claims, and is not limited in any manner by the aforementioned descriptions and drawings.

We claim:

1. A test socket for coupling a microchip to a test apparatus, the socket comprising:
    a tubular elastomer disposed within a cavity in the socket;
    a link bearing against the tubular elastomer such that the elastomer rotationally biases a rounded contact member of the link to a position above an upper surface of the test socket in the absence of a downward force applied on the link, the link further comprising a leg portion terminating in a cylindrical protuberance;
    a mount disposed within the cavity of the socket, the mount including a cylindrical recess sized to receiving the cylindrical protuberance of the link to form a joint hinge that allows rotation in a single plane of the link, the mount further comprising protrusions downwardly projecting from the mount below a lower surface of the socket in the absence of an applied upward force, the mount further comprising an acute angular wall occupying an acute angular recess in the socket, the acute angular recess of the socket opening to the cavity of the socket;
    wherein a height of the cavity above the mount creates a gap between a socket upper wall and an upper surface of the mount, the gap having a vertical spacing that exceeds a distance that the protrusions downwardly project below the lower surface of the socket in the absence of an applied upward force to the protrusions; and
    wherein an upward force on the mount at the protrusions causes the mount to slide diagonally within the acute angular recess against a resisting force applied by the elastomer through the link.

2. The test socket of claim 1, wherein the angular recess forms a sixty degree angle with the lower surface of the socket.

3. The test socket of claim 1, wherein a vertical displacement of the mount to a horizontal displacement of the mount resulting from an upward force applied to the protrusions is a 2:1 ratio.

4. The test socket of claim 1, wherein the mount includes two protrusions spaced at opposite sides of a lower surface of the mount.

* * * * *